US009845548B2

(12) United States Patent
Broyer et al.

(10) Patent No.: US 9,845,548 B2
(45) Date of Patent: Dec. 19, 2017

(54) ADVANCED CRUCIBLE SUPPORT AND THERMAL DISTRIBUTION MANAGEMENT

(71) Applicant: GT Crystal Systems, LLC, Salem, MA (US)

(72) Inventors: David F. Broyer, Kingston, NH (US); Hui Zhang, Nashua, NH (US); Ning Duanmu, Nashua, NH (US); Ian T. Witting, Goffstown, NH (US)

(73) Assignee: GTAT Corporation, Merrimack, NH (US)

( * ) Notice: Subject to any disclaimer, the term of this patent is extended or adjusted under 35 U.S.C. 154(b) by 244 days.

(21) Appl. No.: 14/541,755

(22) Filed: Nov. 14, 2014

(65) Prior Publication Data
US 2015/0176150 A1   Jun. 25, 2015

Related U.S. Application Data

(63) Continuation-in-part of application No. 14/488,501, filed on Sep. 17, 2014.
(60) Provisional application No. 61/884,503, filed on Sep. 30, 2013.

(51) Int. Cl.
*C30B 35/00* (2006.01)
*C30B 11/00* (2006.01)
(Continued)

(52) U.S. Cl.
CPC .......... *C30B 11/002* (2013.01); *C30B 11/003* (2013.01); *C30B 15/14* (2013.01);
(Continued)

(58) Field of Classification Search
CPC ..... C30B 11/003; C30B 11/002; C30B 35/00; C30B 15/10; C30B 15/14; C30B 29/20;
(Continued)

(56) References Cited

U.S. PATENT DOCUMENTS 3,607,111 A * 9/1971 Adamski ................. C30B 11/10
117/207
3,898,051 A * 8/1975 Schmid ................. C30B 11/003
117/83
(Continued)

FOREIGN PATENT DOCUMENTS

CN   202181364 U   4/2012
CN   202187083 U   4/2012
(Continued)

OTHER PUBLICATIONS

International Search Report dated Dec. 23, 2014 issued in connection with PCT/US2014/056064.

*Primary Examiner* — Matthew Song
(74) *Attorney, Agent, or Firm* — Parker Ibrahim & Berg LLC; Stephen D. LeBarron

(57) ABSTRACT

According to the disclosed embodiments, an advanced crucible support system is described that allows for greater heat flow to and from the bottom of a crucible, preferably while also preventing excessive heat from reaching a heat exchanger. In particular, a support base is described that includes one or more vents enabling improved heat flow throughout the system. Also, according to one or more additional embodiments, the functionality of the crucible support is adapted to be leveraged by a crucible manipulating device. For example, the support plate may have a plurality of slots for insertion of a "lifting arm", such that the entire support plate assembly, as well as the crucible itself while on the support assembly, may be lifted and transported as a single unit.

15 Claims, 13 Drawing Sheets

(51) Int. Cl.
*C30B 29/20* (2006.01)
*C30B 15/14* (2006.01)

(52) U.S. Cl.
CPC ............. *C30B 29/20* (2013.01); *C30B 35/00* (2013.01); *Y10T 117/1068* (2015.01); *Y10T 117/1092* (2015.01)

(58) Field of Classification Search
CPC . C30B 35/002; Y10T 117/10; Y10T 117/1068
See application file for complete search history.

(56) References Cited

U.S. PATENT DOCUMENTS

| | | | | |
|---|---|---|---|---|
| 4,218,418 A | * | 8/1980 | Schmid | B22D 27/045 23/301 |
| 6,313,398 B1 | * | 11/2001 | Yamada | H01L 31/0288 136/258 |
| 2010/0061916 A1 | * | 3/2010 | Clark | C30B 11/002 423/348 |
| 2011/0220012 A1 | * | 9/2011 | Wu | C30B 11/003 117/81 |
| 2013/0160704 A1 | | 6/2013 | LaFontaine et al. | |

FOREIGN PATENT DOCUMENTS

| | | | | |
|---|---|---|---|---|
| CN | 202246998 U | | 5/2012 | |
| CN | 202945360 U | | 5/2013 | |
| JP | 09255484 A | * | 9/1997 | ............. C30B 15/30 |

\* cited by examiner

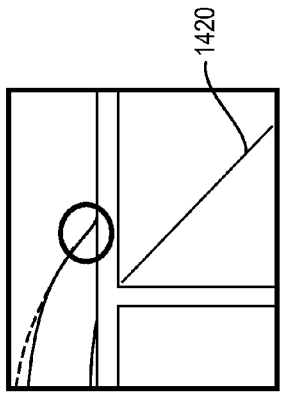
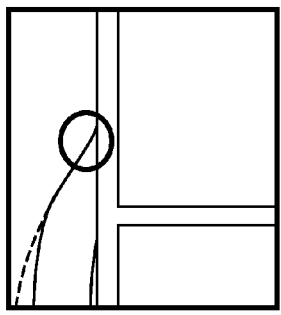
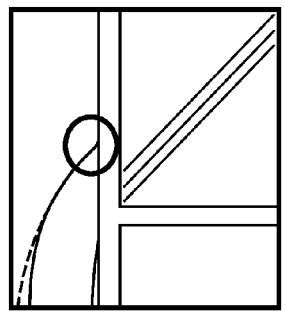
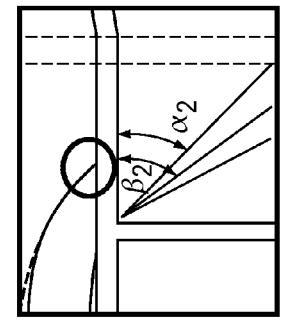
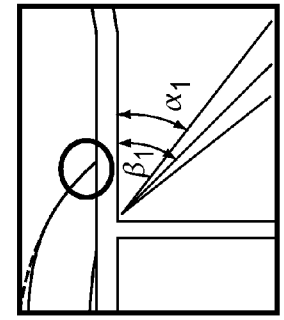
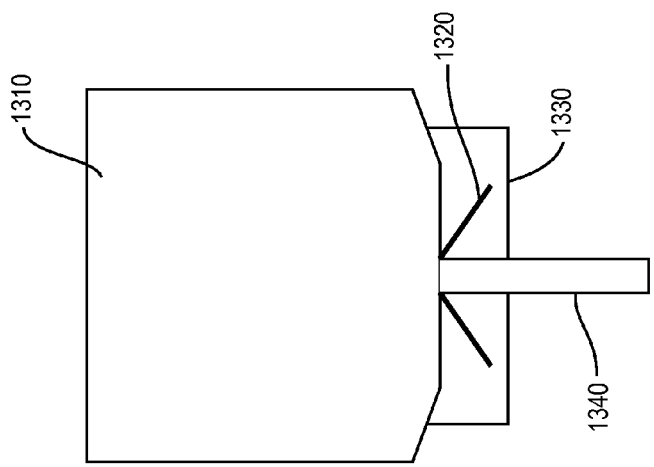

ADVANCED CRUCIBLE SUPPORT AND THERMAL DISTRIBUTION MANAGEMENT

CROSS-REFERENCE TO RELATED APPLICATIONS

The present application is a continuation-in-part of corresponding U.S. patent application Ser. No. 14/488,501 filed Sep. 17, 2014, which claims the benefit of U.S. patent application No. 61/884,503 filed Sep. 30, 2013, both of which are incorporated herein by reference.

BACKGROUND OF THE INVENTION

1. Field of the Invention

The present disclosure relates generally to crystalline material growth systems, and, more particularly, to an advanced crucible support and thermal distribution management.

2. Description of the Related Art

Crystal growth apparatuses or furnaces, such as directional solidification systems (DSS) and heat exchanger method (HEM) furnaces, involve the melting and controlled resolidification of a feedstock material, such as alumina or silicon, in a crucible to produce an ingot or boule. Production of a solidified product from molten feedstock occurs in several identifiable steps over many hours. For example, to produce a silicon ingot by the DSS method, solid silicon feedstock is provided in a crucible, often contained within a graphite crucible box, and placed into the hot zone of a DSS furnace. Alternatively, to produce, for example, a sapphire boule by the HEM method, solid feedstock, such as alumina, is provided in a crucible containing a monocrystalline seed (which comprises the same material as the feedstock but with a single crystal orientation throughout) placed into the hot zone of a solidification furnace. A heat exchanger, such as a helium-cooled heat exchanger, is positioned in thermal communication with the crucible bottom and with the monocrystalline seed. The feedstock is heated to form a liquid feedstock melt, without substantially melting the monocrystalline seed, and the furnace temperature, which is well above the seed melting temperature, is maintained for several hours to ensure proper melting. Once melted, heat is then removed from the melted feedstock by applying a temperature gradient in the hot zone, in order to directionally solidify the melt from the substantially unmelted seed to form the boule. By controlling how the melt solidifies, a crystalline material having a crystal orientation corresponding to that of the monocrystalline seed can be achieved, and having greater purity than the starting feedstock material, can be achieved.

For stability, crucibles are placed into a furnace atop a support structure that generally matches the shape of the crucible's base. Typically, these supports are a solid material, and may generally take the shape of a solid ring, in which the crucible sits. The current crucible support design, however, limits the "view factor" for radiated heat generated from a furnace's heating element from reaching the bottom of the crucible. Because of this fact, the temperature gradient at the base of the crucible is not ideal.

Additionally, the current method of using the crucible itself as a means for establishing a physical interface for a given crucible manipulating device is presenting challenges and safety concerns as the physical size and mass of crucible and charge size increases. In the crystal growth process a ring is used for supporting of the crucible within the hot zone. The ring is currently manually loaded into the furnace as its own discrete loading step, and then several steps follow before a crucible is fully charged and considered ready for the crystal growth process, thus causing issues for any automation requirements for the crucible loading process.

SUMMARY OF THE INVENTION

According to the disclosed embodiments, an advanced crucible support system is described that allows for greater heat flow to and from the bottom of a crucible, while also preventing excessive heat from reaching a heat exchanger. In particular, a support base is described that includes one or more vents enabling improved heat flow throughout the system.

Thus, the present invention relates to a crystal growth apparatus comprising a chamber and a hot zone within the chamber. The hot zone comprises a crucible containing at least solid feedstock and preferably further comprises at least one monocrystalline seed on an interior bottom surface of the crucible. The hot zone further comprises at least one heating system and at least one heat removal system comprising a heat exchanger positioned beneath the crucible and, preferably, in thermal contact with the bottom of the crucible. The hot zone further comprises a crucible support system in contact with an exterior bottom surface of the crucible. The crucible support system comprises a plurality of vents configured to allow heat flow between the heating system and the exterior bottom surface of the crucible. Preferably the crucible support system comprises an aperture configured to allow passage of the heat removal system. In one embodiment, the crucible support system comprises a horizontal support plate having a plurality of upwardly facing crown features configured to receive and vertically support the crucible, the crown features spaced to form the vents. In another embodiment, the crucible support system comprises a horizontal support plate having a plurality of downwardly facing crown features, the horizontal support plate being configured to receive and vertically support the crucible and the crown features spaced to form the vents. In another embodiment, the crucible support system comprises a horizontal support plate and a downwardly facing vertical wall having a plurality of shaped openings, the horizontal support plate being configured to receive and vertically support the crucible and the shaped openings forming the vents. The present invention further relates to a method of producing a crystalline material. such as a sapphire boule, using this crystal growth apparatus, as well as to the resulting sapphire boule produced in the disclosed crystal growth apparatus.

It is to be understood that both the foregoing general description and the following detailed description are exemplary and explanatory only and are intended to provide further explanation of the present invention, as claimed.

BRIEF DESCRIPTION OF THE DRAWINGS

The foregoing and other objects, features, aspects and advantages of the embodiments disclosed herein will become more apparent from the following detailed description when taken in conjunction with the following accompanying drawings, of which:

FIG. 13 illustrates an example specific component of crucible support system, and FIGS. 14A-C and FIGS. 15A-B illustrate corresponding thermal modeling results.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE INVENTION

The present invention relates to a crucible support system for a crystal growth apparatus.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Figure 1:
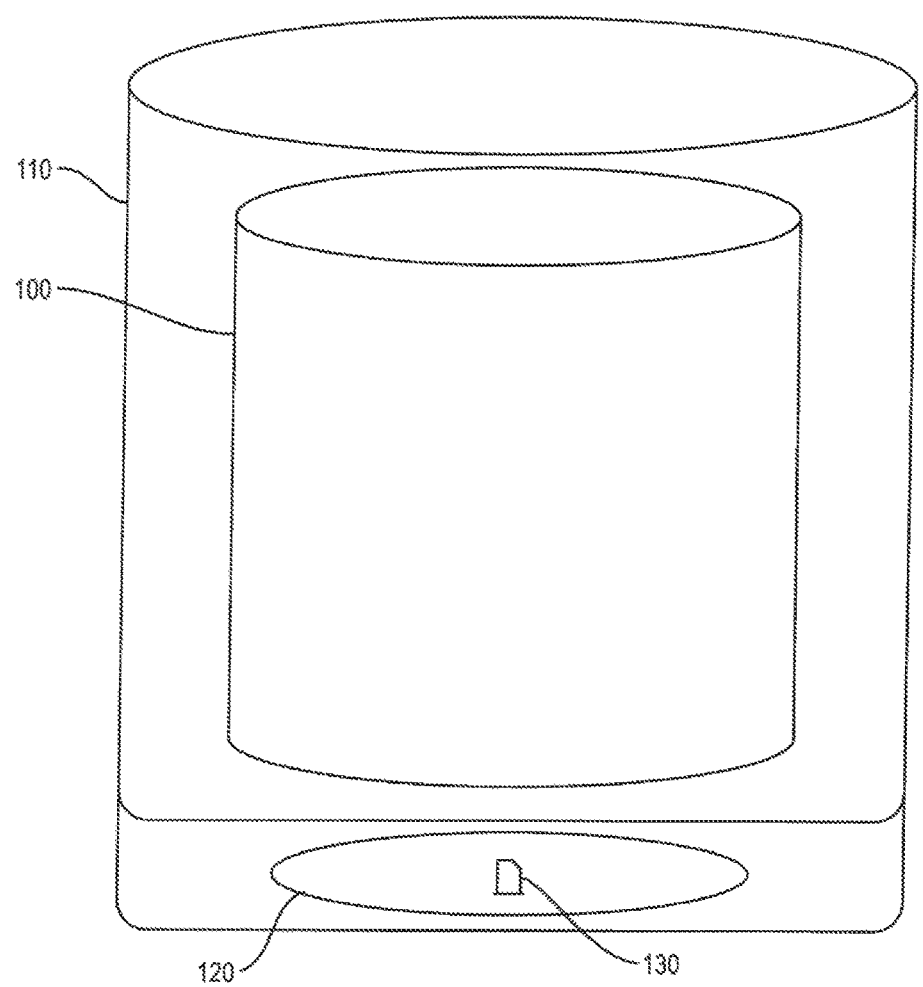
FIG. 1 illustrates an example furnace and crucible configuration.

FIG. 1 illustrates a conventional crystalline material growth system. As shown in FIG. 1, a conventional crystalline material growth system includes a crucible 100, a furnace chamber 110, a crucible support (e.g., ring) 120, and a heat exchanger 130. The system also includes a heating system, such as one or more heating elements (not shown). The crystal growth apparatus of the present invention also comprises these general conventional components, with modifications and specifications as described in more detail below which surprisingly provide improved crystal growth conditions and resulting high quality crystals in high yield.

Thus, in general, the crystal growth apparatus comprises a chamber and a hot zone within the chamber, the hot zone comprising at least one heating system, at least one heat removal system (i.e., a heat exchanger), a crucible containing at least solid feedstock, and a crucible support. The crucible can conventionally be any container known in the art for holding, melting, and resolidifying a feedstock material. For example, when producing silicon or sapphire crystal, quartz or graphite crucibles are typical, respectively. Additionally or alternatively, the crucible may be made of, for example, molybdenum, silicon carbide, silicon nitride, composites of silicon carbon or silicon nitride with silica, pyrolytic boron nitride, alumina, or zirconia and, optionally, may be coated, such as with silicon nitride, to prevent cracking of the ingot after solidification. The crucible may also have a variety of different shapes having at least one side and a bottom, including, for example, cylindrical, cubic or cuboid (having a square cross-section), or tapered. In particular, the crucible may have a generally cylindrical shape, with the exterior bottom surface having a tapered or angled outer region or surface and a horizontal center bottom region or surface, as generally illustrated in, for example, FIG. 4, FIG. 8, FIGS. 9A-B, FIGS. 11A-B, and FIG. 13. The angle of the outer region of the crucible bottom can vary but is generally less than about 30 degrees, forming an angle of greater than 150 degrees with the horizontal center bottom section, depending, for example, on the size of the crucible and the size of the feedstock charge. For example, the crucible bottom may have an outer region angled at between about 5 degrees and about 25 degrees. Larger angles, such as between about 15 degrees and about 25 degrees, may be preferred for larger crucibles containing higher levels of feedstock, such as greater than 200 kg.

The crucible may be disposed in an interior portion of a crystallization furnace including a furnace chamber having a bottom wall and side walls that define the interior portion. The crystallization furnace may be any device suitable for heating and melting a feedstock material at high temperatures, e.g., greater than 1000° C., and subsequently for allowing resolidification of the melted feedstock material. Suitable furnaces include, for example, crystal growth furnaces and DSS furnaces. Typically, the furnace may be provided in two parts, e.g., a furnace top and a furnace bottom, which can be separated in order to access the interior portion of the furnace, for example, to load the crucible therein. The furnace also comprises at least one heating system (including one or more heating elements, such as graphite resistance heaters) for heating and melting the feedstock material, as well as at least one means for measuring the temperature within the hot zone, such as, for example, one or more black body tubes inserted through the side or top of the furnace chamber walls. It may be preferable, particularly for larger crucibles containing a high charge size of feedstock material, that the black body be positioned above the crucible, in order to avoid cool spots during growth, resulting in poor crystal properties and/or reduced yield of high quality crystalline material.

The heat exchanger may include an elongated shaft that extends in a vertical direction, e.g., an up-and-down direction as shown in FIG. 1 and FIG. 13, and traverses the bottom wall of the furnace chamber. A first end portion of the heat exchanger shaft may be coupled to the crucible, and particularly, a base of the crucible. Thus, for example, the heat exchanger may be positioned so that the top of the heat exchanger is in contact with the exterior bottom surface of the crucible, preferably the horizontal center region of the crucible bottom. The heat exchanger may maintain a particular temperature of a melted feedstock by allowing cooling medium, such as a cooling fluid or gas, to pass through the heat exchanger shaft.

Figure 2:
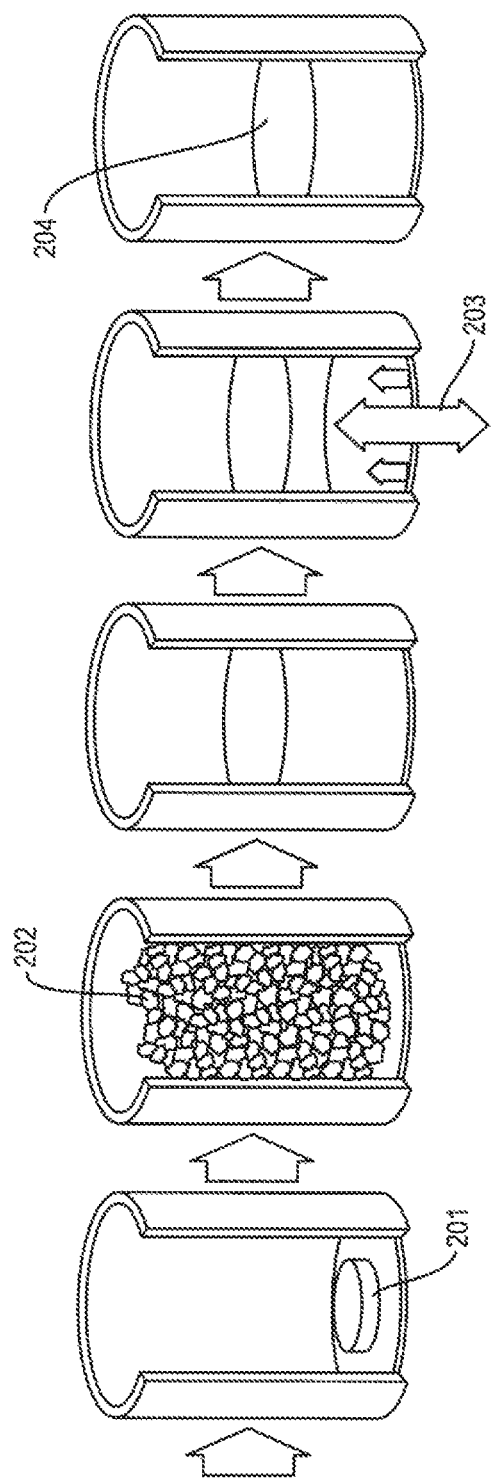
FIG. 2 illustrates an example boule production process.

With reference generally to FIG. 2, in a typical HEM implementation, at least one monocrystalline "seed" 201 may be placed into the crucible 100, particularly in the center of the interior surface of the bottom of the crucible, and then feedstock or "charge" material 202, e.g., silicon or aluminum oxide, may be placed into the crucible and then melted by heating the crucible walls. During the melting, the heat exchanger maintains the seed crystal at a temperature slightly below its melting point, e.g., using cooling fluid or gas passing through the heat exchanger shaft, such as helium, to keep the seed in solid form. In this way, the seed itself is only partially melted, and the amount of melt back can be controlled or managed generally by the heat exchanger. After the feedstock material is melted, the resulting melt may be cooled to allow for resolidification through heat extraction 203. Crystallization ("growth") initiates from the partially melted seed surface, and the resolidified material (i.e., the "growth front") expands in three dimensions. Thus, for preparing sapphire in a heat exchanger method crystal growth furnace, including the crystal growth apparatus of the present invention, a crucible comprising alumina feedstock and at least one single crystal sapphire seed is heated above its melting point to melt the feedstock without fully melting the seed, and the heat is then removed from the crucible using a heat exchanger, such as a helium-cooled heat exchanger, provided in thermal communication with the exterior bottom of the crucible and positioned under the seed. When crystallization is complete, the furnace temperature is decreased and the crystal ingot (boule) 204 can be slowly annealed if desired. The crystallization process in its entirety may take approximately 72 hours.

As discussed above, crucibles are placed into a furnace 110 atop a support structure that generally matches or fits the shape of the crucible's base. Typically, these supports are a solid material, and may generally take the shape of a solid ring. The current crucible support design, such as the crucible support ring 120 of the conventional crystalline material growth system shown in FIG. 1, however, limits the "view factor" for radiated heat generated from a furnace's heating element from reaching the bottom of the crucible. Because of this fact, the temperature gradient at the base of the crucible is not ideal.

The present disclosure, in one embodiment, thus provides an advanced crucible support system that allows for greater heat flow to and from the bottom of the crucible, preferably while also preventing too much heat from reaching the heat exchanger. In particular, by introducing "vents" into the support system (e.g., the "ring" 120 above), heat may more easily reach the base of the crucible during the heating process, and may also more easily leave the base during the cooling process. In addition, various features may also prevent the additional heat flow from impinging on the operation of the heat exchanger, i.e., minimizing heat transfer to the heat exchanger, allowing it to maintain its proper cooling capacity. By allowing the redirection of heat to radiate evenly in this manner, a steeper heat gradient is present at the bottom of the crucible around the heat exchanger, beneficially producing greater melting force to the base for feedstock, yet allowing the seed to be maintained in its solid form nearest the heat exchanger.

In particular, according to one or more illustrative embodiments herein, an advanced crucible support "crown" now allows for a better view factor to the bottom of the crucible. For example, with reference to FIG. 3, an example crucible support crown 300 is shown, where raised "crown" features 301 (e.g., with an example tantalum shim) are spaced generally evenly around a horizontal support base or plate 302 (e.g., an isostatically pressured fine-grain graphite material) which includes an aperture 303 in the support based plate configured to allow passage of a heat exchanger. The raised crown features create gaps or openings (i.e., "vents") that allow for ventilation to and from the bottom of the crucible. Additionally, the support base plate 302 defines a plurality of slotted apertures 305. This plurality of slotted apertures 305 are each configured to allow passage of a respective lifting arm (shown in FIG. 7-9B), which when rotated while through the slotted aperture 305, results in engagement of the support base plate by the respective lifting arm.

Figure 3:
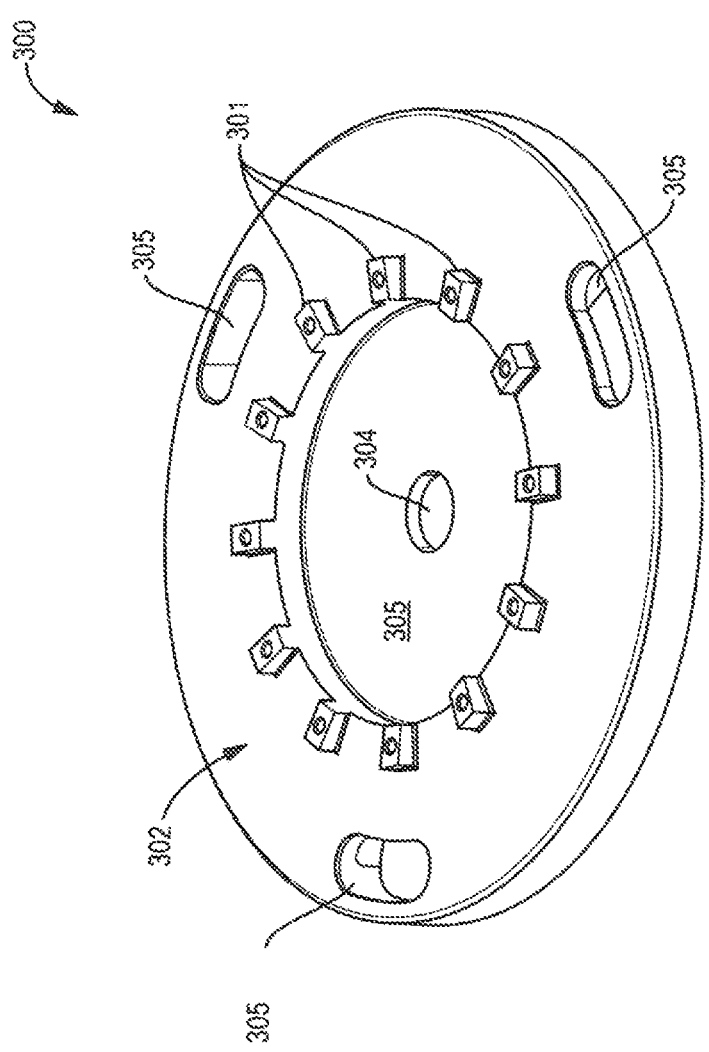
FIG. 3 illustrates an example crucible crown support.
Figure 4:
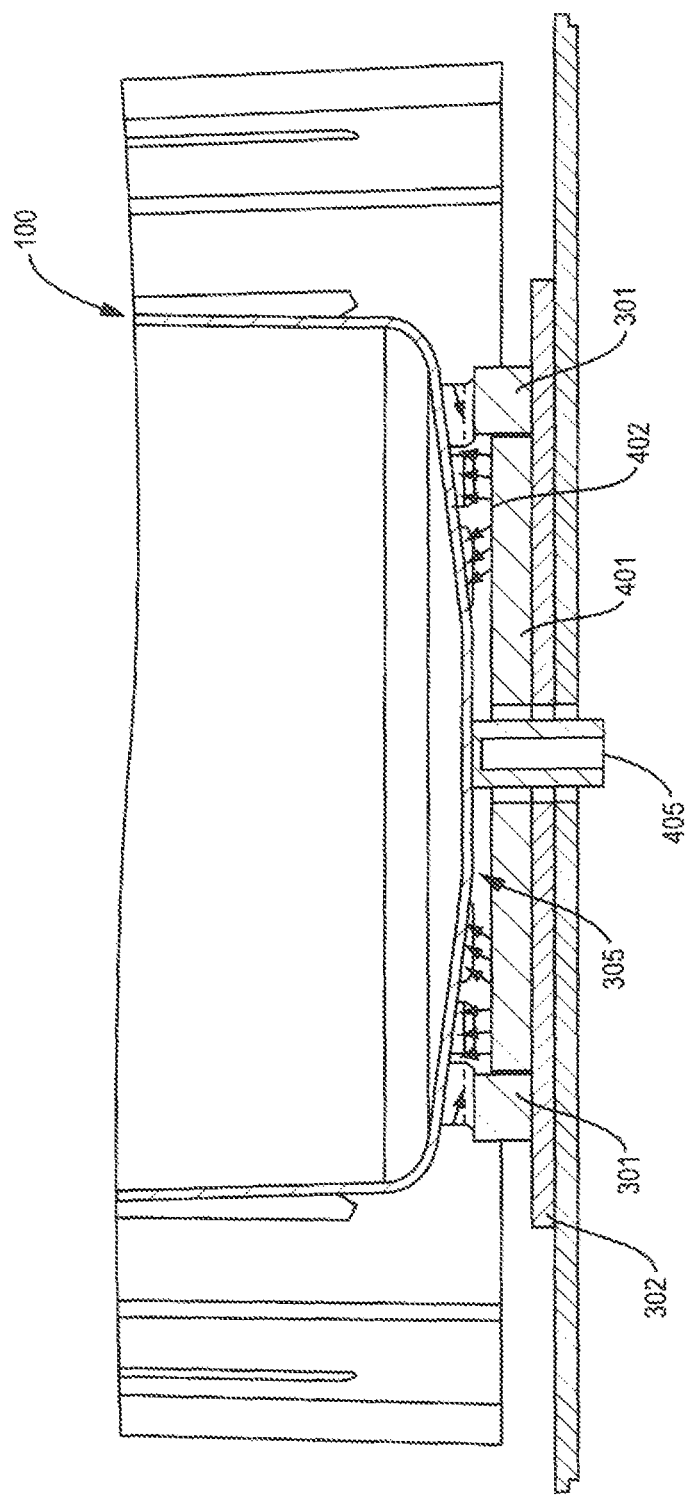
FIG. 4 illustrates an example crucible crown support system.

FIG. 4 illustrates an example side view of the example crucible support crown system 300 of FIG. 3, showing the crucible 100 resting on the support 300, along with optional layers of insulation 401 and low emissivity medium 402 (e.g., tungsten sheet), discussed in more detail below. In particular, a crown support plate (i.e., support base plate 302) supports the plurality of "crown" features 301, surrounding a recessed cavity 305 in which optional insulation 401 and an optional low emissivity shield may be placed to prevent heat from reaching the heat exchanger ("cold finger") 405.

Note that as shown in FIGS. 5A-C, the crown features 301 may have removable shims 501 for durability, such as tantalum shims (e.g., with a retaining feature, such as a detent/protrusion arrangement), which may be replaced over time as necessary. As can be seen, the crown features may be angled to match the shape of the bottom of the crucible. In addition, the shims may also provide a finer tuned matching of the shape, compensating for any manufacturing variability. Alternatively, the crown features may be horizontally flat and the shims angled to match the crucible bottom.

Figure 5:
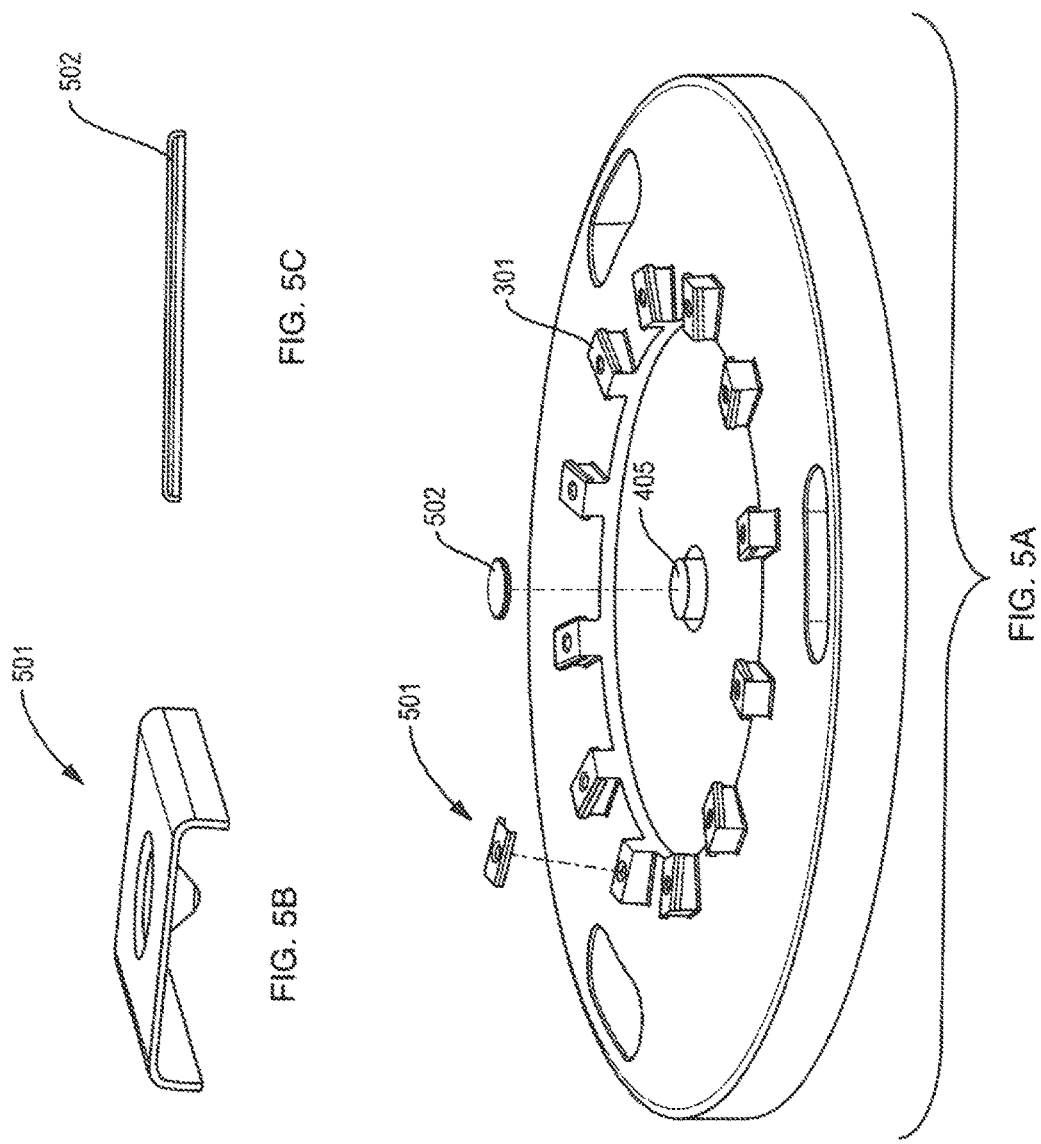
FIGS. 5A-C illustrates an example of shims for the crucible support.

Thus, as shown in FIG. 3, FIG. 4, and FIG. 5, the exemplary crucible support system comprises a horizontal support plate having a plurality of upwardly facing crown features configured to receive and vertically support the crucible, particularly the crucible bottom, with the crown features forming vents that allow heat to flow between the heating system (not shown) and the exterior bottom surface of the crucible. Preferably, the crown features are distributed symmetrically around the horizontal base plate, providing a more even heat distribution and flow. As is also shown, the crucible support system may further comprise an aperture or opening, preferably in the center of the support plate, which is configured to allow passage of the heat exchanger. Furthermore, a cap or shim, such as a tungsten cap, may be placed onto the heat exchanger to allow for greater thermal contact to the exterior surface of the base of the crucible.

Figure 11B:
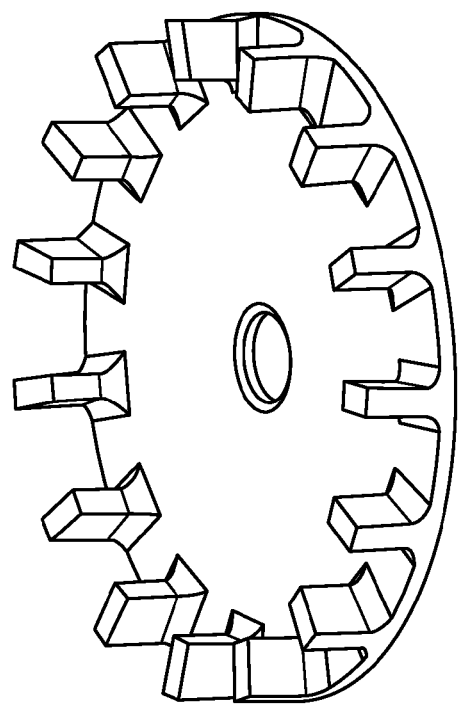
FIGS. 11A-B and FIG. 12A-C illustrate example crucible support systems.
Figure 11A:
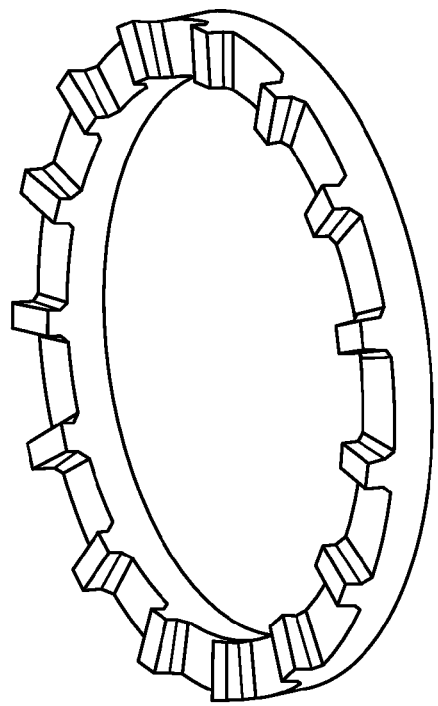

Thus, the crucible support system may comprise a horizontal support plate having a top surface with features forming vents (such as the illustrated crown features) and a center region having an aperture or opening for the heat exchanger. In addition, the crucible support system plate may have a ring shape, such as an open circular ring, with crown features on the top surface of the ring. A specific example is shown in FIG. 11A. The relative height and number of the "teeth" of the crown features, as well as the thickness of the ring or plate, can be varied depending on a variety of factors including, for example, material availability and cost, the desired heat flow, the size of the crucible, and the amount (weight) of the feedstock. For example, FIG. 11B shows a circular crucible support plate that is thinner than those shown in FIG. 3, FIG. 4, or FIG. 5 (and also thinner than the support ring shown in FIG. 11A) but has taller "teeth" symmetrically positioned around the outer perimeter of the horizontal support plate. Such an arrangement has been found to provide improved heat flow without significantly affecting the support of the crucible bottom.

Figure 12B:
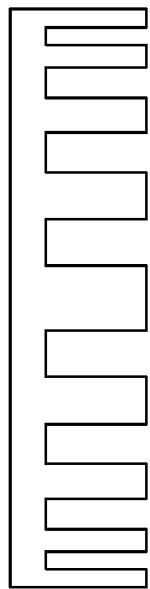
Figure 12C:
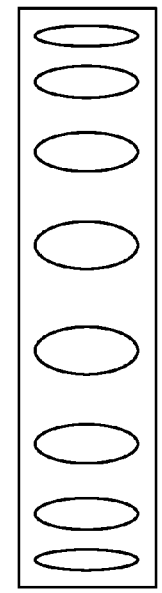
Figure 12A:
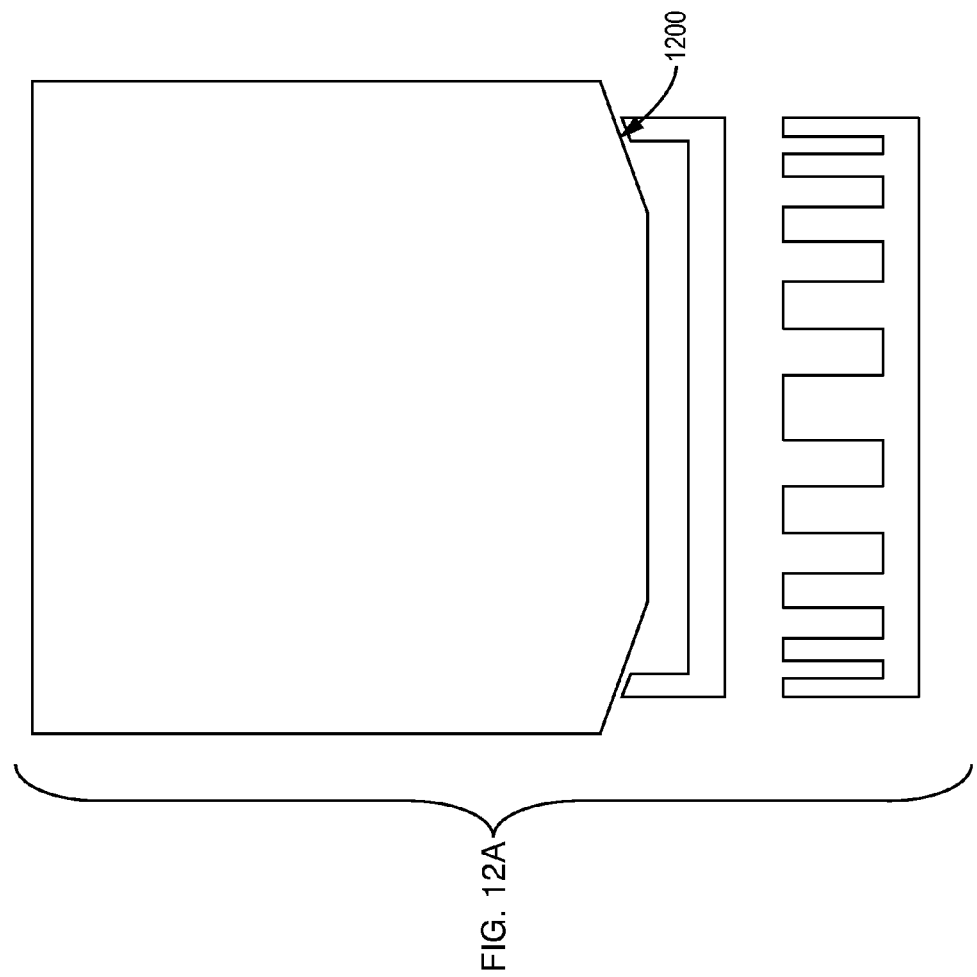

Additional examples of crucible support systems are shown in FIGS. 12A-C. These have been found to be particularly useful for larger crucibles containing a large quantity of feedstock (such as greater than 200 kg, including greater than 250 kg). For example, it has been found that the weight of the molten feedstock in the crucible resting on upwardly facing crown features (such as shown in FIG. 12A) can create pressure points 1200 from the teeth, causing indentations in the bottom of the crucible, which can lead to undesirable conditions for crystal growth, causing defects and potential cracking of the grown crystal. In order to avoid this drawback, an advanced crucible support system can be used comprising a horizontal base plate, such as a ring, having a top surface configured to receive and vertically support the crucible and further having a plurality of vents to provide the desired heat flow. The vents may have a variety of different shapes, including, for example, rectangular, square, round, or oval. Specific examples are shown in FIG. 12B and FIG. 12C. Thus, as shown in FIG. 12B, the crucible support system can comprise a horizontal plate or ring having a plurality of downwardly facing crown features spaced to form the vents. In this way, the ring or plate would support the crucible, and the teeth of the crown would provide the desired heat flow. The surface of the horizontal plate may be angled to match or fit any angled bottom region of a crucible. The teeth may be positioned on or attached to a bottom support plate if needed. In addition, as shown in FIG. 12C, the crucible support system can comprise a horizontal plate or ring and a vertical wall having a plurality of shaped openings (such as the oval openings shown in FIG. 12C). Each of these support rings would have a constant contact around the exterior bottom surface of the crucible, distributing the weight and avoiding pressure points. Other designs and structures would be known to one of ordinary skill in the art, given the benefit of this disclosure.

Due to the increased flow of heat, the crucible support systems described above may now also expose the heat exchanger ("HEX") to this same radiated heating, which can have a negative impact on the crystal growth process, particularly in the seed melt back stage. For example, as described above for growing sapphire using the heat exchanger method, a monocrystalline seed is placed on the interior bottom of the crucible, and feedstock is provided above it. The feedstock is melted while only partially melting the seed, controlled, in part, by the flow of coolant in the heat exchanger. Some melt back of the seed may be desirable, for example, to provide a clean surface for crystal growth. However, a substantial amount of the seed should remain to ensure a high yield of high quality crystalline product. It has been found that the shape of the surface of the partially melted seed has a significant impact on the quality of the final grown crystal since it provides a baseline for the shape of the crystal growth front. A convex growth profile is particularly preferred, and formation of such a profile can be impacted by the heat flow beneath the crucible.

In order to mitigate heating of the heat exchanger's top and outside surfaces and to provide the desired crystal growth shape, the advanced crucible support system described above may further include insulating features placed within the recessed cavity surrounding the heat exchanger. For example, one implementation may use a layer of insulation inserted into the center cavity of the crucible support crown. The insulation minimizes heat conduction to the heat exchanger. In addition, a layer/sheet of a material having low emissivity (e.g., tungsten) may also be inserted into the center cavity, such as in the support plate or around specific portions of the heat exchanger, where the low emissivity helps to reflect the radiation back to the crucible bottom. In this arrangement, the heat flow is more isothermal, thus not "bleeding" heat out of the bottom of the system (i.e., reaching the support plate), and redirecting it toward the crucible.

A particularly advantageous arrangement is illustrated schematically in FIG. 13. As shown, crucible 1310 is positioned upon crucible support 1330 through which is inserted heat exchanger 1340. Radiation shield 1320 is positioned around the top portion of heat exchanger 1340, acting to insulate or shield the top outer surfaces of heat exchanger 1340 exposed within the cavity of the crucible support. Preferably, low emissivity materials are used for the radiation shield to reflect the heat back to the crucible bottom. While crucible support 1330 may be any support known in the art, preferably the support is an advanced crucible support system described above.

As shown in FIG. 13, the radiation shield has a generally inverse conical shape, forming essentially an "umbrella" conformation over the upper section of the heat exchanger. The shape, length, angle, and positioning of the shield relative to the heat exchanger top can be varied depending, for example, on the type of material used and the radiational effect desired. For example, the shield can be conical (having linear sides) or can be dome-shaped (having curved sides) and is preferably positioned near or at the top of the heat exchanger. Multiple thermal shields can also be used. Furthermore, the radiation shield preferably extends from the top of the heat exchanger angled toward the crucible support, shielding as much of the exposed exterior surface of the heat exchanger as possible. In this way, the shield is preferably not in direct contact with the heat exchanger shaft, except at the top, in order to minimize or prevent conduction of heat from the shield to the heat exchanger. The radiation shield can form an angle with the horizontal exterior surface of the crucible bottom that preferably ranges from about 10 degrees to about 80 degrees, more preferably from about 20 degrees to about 60 degrees. Most preferably, the angle between the radiation shield and the horizontal bottom of the crucible is less than or equal to about 45 degrees. Also, the radiation shield can comprise any material capable of withstanding the temperatures and conditions used for the crystal growth, including, for example, low emissivity metallic materials such as molybdenum, tungsten, or tantalum which would reflect heat away from the heat exchanger and towards the bottom exterior surface of the crucible. Thus, preferably, the radiation shield comprises a heat reflective outer surface facing the crucible. More preferably, the shield further comprises a heat reflective or insulating interior surface to maintain the relatively cooler exterior heat exchanger surface. Thus the shield can be used to create two different thermal regions within the cavity of the crucible support—an exterior heated region reflecting heat to the crucible and an interior cooling region, maintaining the cooler surface of the heat exchanger.

An insulating or low emissivity feature, such as a reflective thermal shield, would be expected to provide improvements in crystal growth as well as in the properties of the resulting grown crystal, with or without an advanced crucible support system such as those shown above. In particular, thermal modeling studies demonstrated that a thermal shield positioned at the top portion of the heat exchanger produces an improved melt back profile which, as described above, has a significant impact on the quality of the final grown crystal since it provides a baseline for the shape of the crystal growth front. This is shown in the examples provided in FIGS. 14A-C and FIGS. 15A-B. In particular, as shown in FIG. 14A, the shape of the melt back interface produced with no radiation shield includes an inflection point (circled)

compared to the shape of the target convex melt back interface (dotted line). Inclusion of radiation shield 1420 dramatically improves the shape of the melt back profile (as shown in FIG. 14B).

In addition, multiple radiation shields can be used to provide further improvements, as shown in FIG. 14C. In particular, results show that multiple shields, each forming a similar angle with the horizontal exterior bottom surface of the crucible, can produce a melt back profile nearly identical to the desired targeted convex shape. A specific example is shown in FIG. 15A, in which three shields having different and sequentially increasing angles, are used. Each shield can comprise the same or different materials, and the spacing between the shields may be varied as desired. For example, the outermost shield can comprise a low emissivity metal such as tantalum, while the interior shields can comprise a thermally insulating material, such as graphite. Alternatively, the outermost and innermost shields can comprise thermally reflective metals while the interior shield can comprise an insulating material, to prevent or minimize heat transfer between the outer two shields. Other combinations are also possible. The use of an insulating material may also minimize or prevent undesired chemical reactions of the shields with adjacent shields and/or with the heat exchanger surface. Therefore, it is preferred that each shield be separated from adjacent shields in order to minimize or prevent heat conduction and material degradation. In addition, while the angles of the shields can be varied, as discussed above for a single radiation shield, it is preferred that the outermost shield form an angle with the horizontal exterior surface of the crucible bottom that is less than or equal to about 45 degrees. For example, as shown in FIG. 15B, while improvements in melt back profile are seen compared to FIG. 14C, an angle ($\alpha 2$) of the outermost shield that is greater than about 45 degrees produces a melt profile having an slight inflection from the desired convex shape, compared to the profile produced using a shield having an angle ($\alpha 1$) that is less than about 45 degrees, as shown in FIG. 15A.

As mentioned above, the current method of using the crucible itself as a means for establishing a physical interface for a given crucible manipulating device is presenting challenges and safety concerns as the physical size and mass of crucible and charge size increases, and also causes issues for automation requirements due to a lengthy manual process of loading the support ring, and then the crucible, and so on.

According to one or more specific embodiments herein, the functionality of the crucible support is adapted to be leveraged by a crucible manipulating device for charging of the crucible, loading and unloading from furnace, and potentially for subsequent post crucible/boule processing steps. In particular, with reference again to FIG. 3, the support base plate 302 may have a plurality of slots 305 for insertion of a "lifting arm" 701 (see FIG. 7), such that the entire support plate assembly, as well as the crucible itself while on the support assembly, may be lifted and transported as a single unit.

Figure 6:
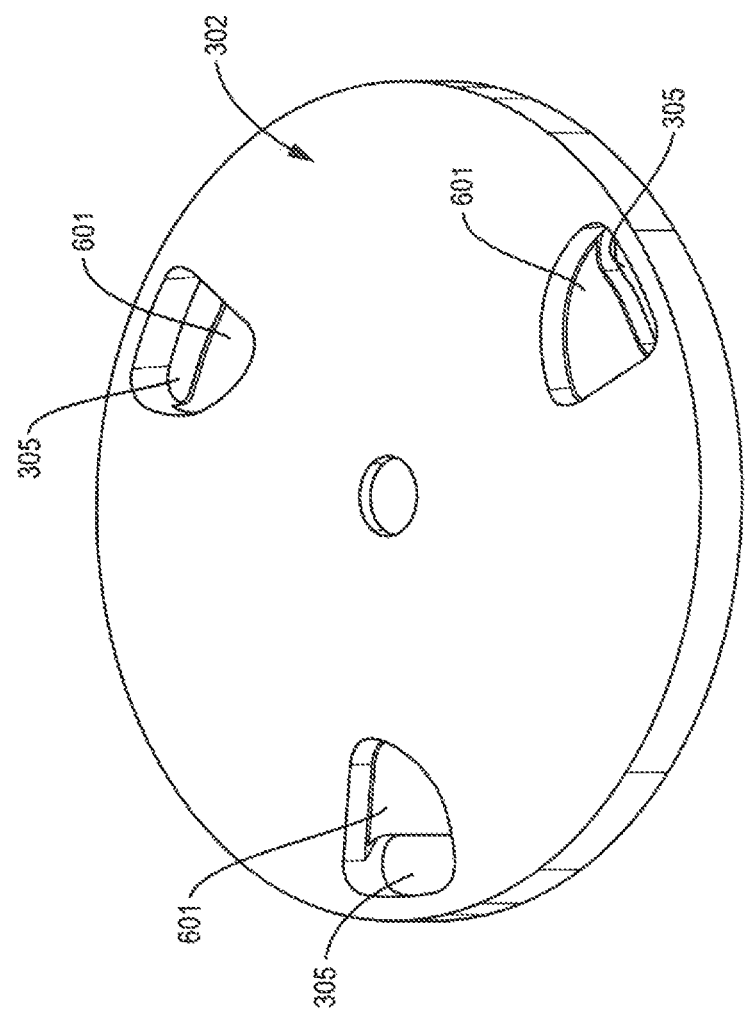
FIG. 6 illustrates an example crucible support configured for lifting support.

For instance, with reference now to FIG. 6, the bottom view of the support plate 302 reveals cavities 306 on the reverse side of the slots 305, such that an arm may be inserted through the slots, and rotated (e.g., toward the center) to engage the support plate 302. Illustratively, for strength, the cavities 306 reside under a castle feature, though this is not a necessary implementation in the event the support plate is considered to be strong enough to support the weight of a loaded crucible between the castle features.

Figure 7:
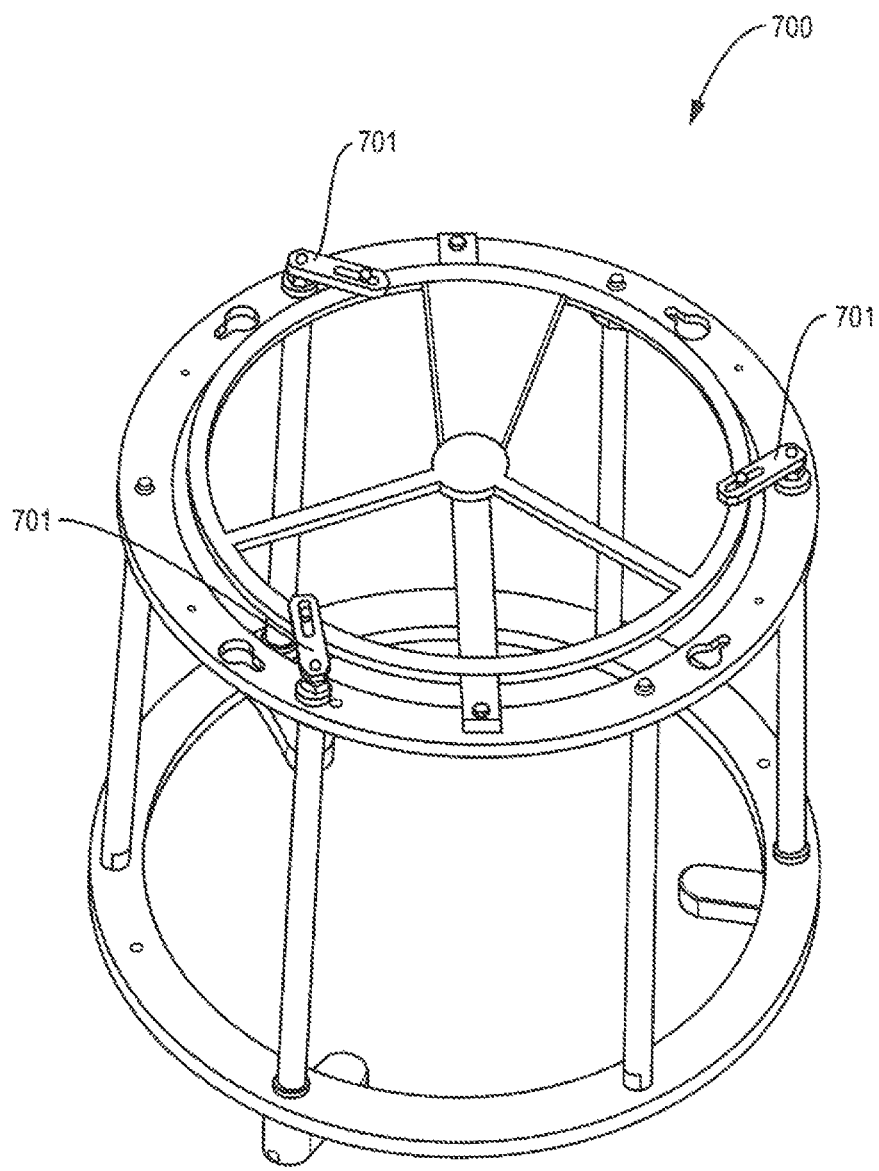
FIG. 7 illustrates an example crucible manipulator.
Figure 8:
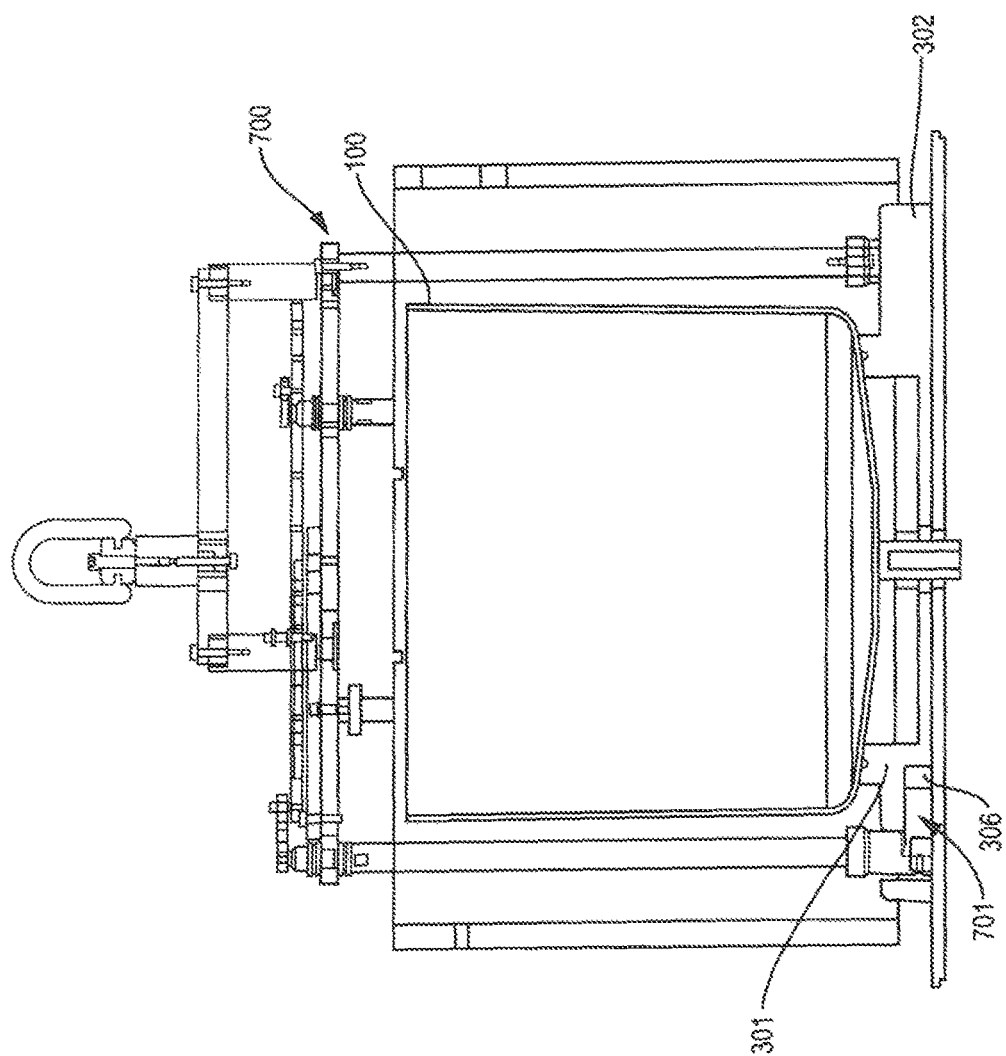
FIG. 8 illustrates an example manipulator layout.
Figure 9A:
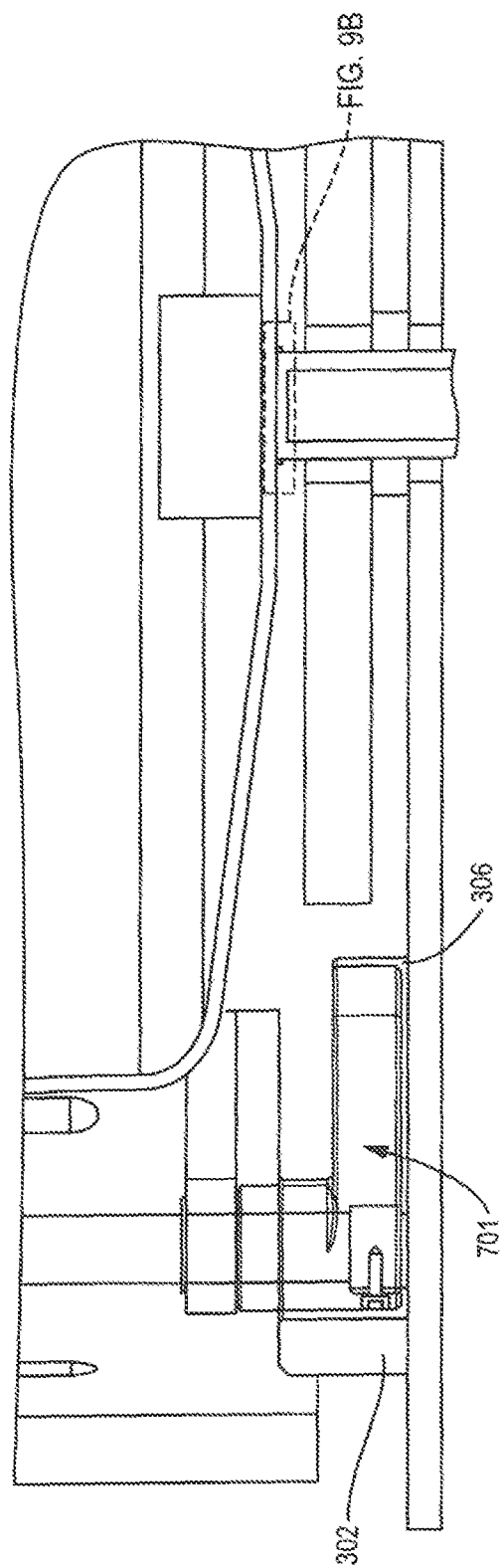
FIGS. 9A-B illustrates another example manipulator layout.
Figure 9B:
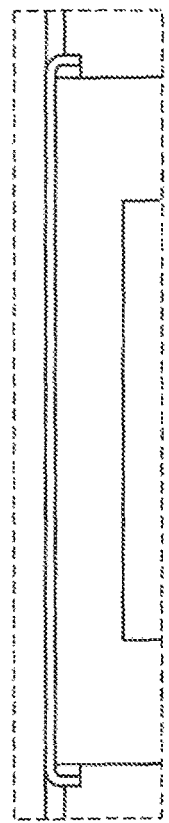

A better understanding of the crucible transportation techniques described herein may be obtained with reference to FIGS. 7-9B, generally. In particular. FIG. 7 illustrates an example lifting arm mechanism ("manipulator") 700, which is designed to slide over a crucible 100, and engage the lifting arms 701 through the slots 305 of the support plate 302, as shown in greater detail in FIG. 8 and FIGS. 9A-B. (Note that the term "putter" refers to the general shape of the illustrative lifting arm 701 representing a golfer's putter.) As shown particularly in FIG. 8, the manipulator 700 may implement linkages, thrust bearings, lift rods, a detachable crane hoist, etc. The top components of the lifting mechanism 700 may comprise a configuration suitable for controlling the rotation of the lifting arms 701, to engage the "putter end" 701 within the corresponding cavities 306 of the support plate 302. Once engaged, the crucible and support plate may be manipulated, transported (filled or otherwise), placed into a furnace, removed from a furnace, and so on. In this manner, not only is the crucible easier to manipulate in general, but the entire arrangement lends itself well to automated facilities.

Figure 10:
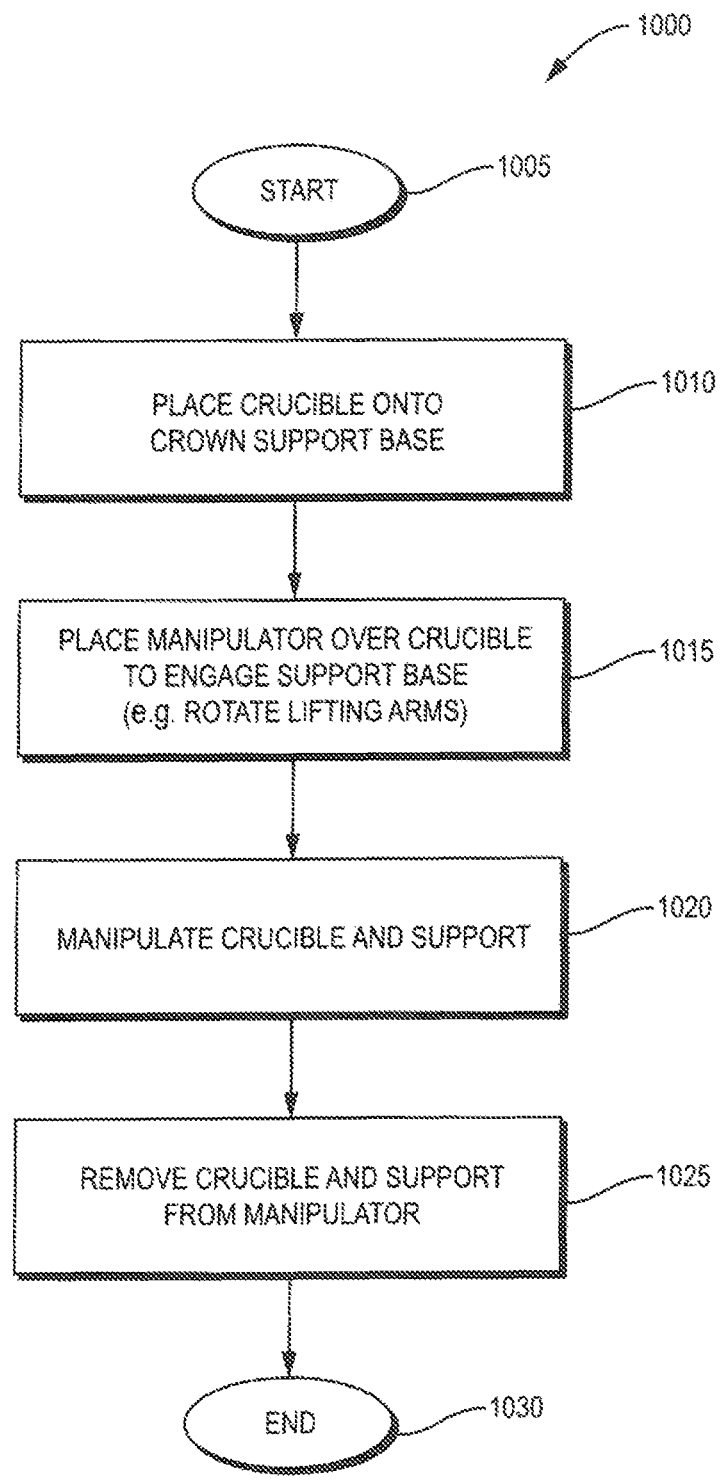
FIG. 10 illustrates an exemplary procedure for use with an advanced crucible support and thermal distribution management system.

FIG. 10 illustrates an example simplified procedure for use with an advanced crucible support and thermal distribution management system. As shown in FIG. 10, the procedure 1000 may start at step 1005, continue to step 1010, where, as described in greater detail above, a crucible may be placed onto a crown support. A manipulator (lifting mechanism) may then be placed over the crucible to engage the support base in step 1015 (e.g., rotating the lifting arms), and then in step 1020 the crucible and support may be manipulated (moved, transported, etc.) to a desired location. Once complete, in step 1025 the crucible and support may be removed from the manipulator (e.g., reverse rotating the lifting arms). The procedure 1000 ends in step 1030.

Notably, procedure 1000 makes no specific reference to what actions are performed to the crucible at which times, such as filling the crucible, emptying the crucible, heating/cooling the crucible, etc., as each of these activities may occur at any time during the manipulation process. It should be understood that the steps shown in FIG. 10 are merely examples for illustration, and certain steps may be included or excluded as desired. Further, while a particular order of the steps is shown, this ordering is merely illustrative, and any suitable arrangement of the steps may be utilized without departing from the scope of the embodiments herein.

The crystal growth apparatus and method described above has been found to produce a high yield of crystalline material, particularly sapphire, having a significantly reduced number of defects, including lineage decoration defects, upon boule inspection. Such high quality sapphire material could be used economically in a variety of applications, including, for example, to form transparent laminates or composites for the cover glass or display window for consumer goods, such as watches, mobile phones, and other mobile electronic devices, including media players, mobile telephones (cell phones), personal data assistants (PDAs), pagers, and laptop computers and notebooks. Such applications require high quality transparent materials to protect the electronic devices from excessive mechanical and/or chemical damage, particularly from careless handling, including dropping or contact of the screen from sharp items in a user's pocket or purse. Thus, the present invention further relates to a sapphire boule formed in a crystal growth apparatus described above. The sapphire boule has fewer crystalline defects compared to a sapphire boule formed in a conventional/comparative crystal growth apparatus, not comprising the various components and improvements described above.

The components, arrangements, and techniques described herein, therefore, provide for an advanced crucible support and thermal distribution management. In particular, the embodiments described herein optimize support of crucibles, such as those used to grow sapphire boules, while optimizing thermal management to the crucible base, crystal seed, and a heat exchanger cap. In addition, the techniques herein change from using the crucible itself as the physical attachment interface for loading and unloading, to now using the crucible support as the mechanical interface, allowing for ease of operation and greater access for automated manufacturing processes.

While there have been shown and described illustrative embodiments that provide for an automated heat exchanger alignment means, it is to be understood that various other adaptations and modifications may be made within the spirit and scope of the embodiments herein, with the attainment of some or all of their advantages. Therefore, it is the object of the appended claims to cover all such variations and modifications as come within the true spirit and scope of the embodiments herein.

The invention claimed is:

1. A crystal growth apparatus comprising:
a chamber and
a hot zone within the chamber, the hot zone comprising at least one heating system, at least on heat removal system, a crucible containing at least solid feedstock, and a crucible support system in contact with an exterior bottom surface of the crucible, the heat removal system comprising a heat exchanger positioned beneath the crucible, wherein the crucible support system is a ring having a constant contact around the exterior bottom surface of the crucible,
wherein the crucible support system comprises a plurality of vents configured to allow heat flow between the heating system and the exterior bottom surface of the crucible.

2. The crystal growth furnace of claim 1, wherein the crucible support system comprises an aperture configured to allow passage of the heat removal system.

3. The crystal growth apparatus of claim 1, wherein the crucible support system comprises a horizontal support plate having a plurality of downwardly facing crown features, the horizontal support plate being configured to receive and vertically support the crucible and the crown features spaced to form the vents.

4. The crystal growth apparatus of claim 3, wherein the exterior bottom surface of the crucible comprises an angled outer region and wherein the horizontal support plate has an upper surface angled to match the angled outer region of the exterior bottom surface of the crucible.

5. The crystal growth apparatus of claim 3 further comprising at least one shim positioned between the horizontal support plate and the exterior bottom surface of the crucible.

6. The crystal growth apparatus of claim 3, wherein the c crucible has a cylindrical shape and wherein the crucible support system is a circular support ringhaving the plurality of downwardly facing crown features.

7. The crystal growth apparatus of claim 1, wherein the crucible support system comprises a horizontal support plate and a downwardly facing vertical wall having a plurality of shaped openings, the horizontal support plate being configured to receive and vertically support the crucible and the shaped openings forming the vents.

8. The crystal growth apparatus of claim 7, wherein the exterior bottom surface of the crucible comprises an angled outer region and wherein the horizontal support plate has an upper surface angled to match the angled outer region of the exterior bottom surface of the crucible.

9. The crystal growth apparatus of claim 7 further comprising at least one shim positioned between the horizontal support plate and the exterior bottom surface of the crucible.

10. The crystal growth apparatus of claim 7, wherein the crucible has a cylindrical shape and wherein the crucible support system is a circular crucible support ring having the plurality of shaped openings.

11. The crystal growth apparatus of claim 7, wherein the shaped openings are circular oval, rectangular, or square.

12. The crystal growth apparatus of claim 1, wherein the crucible further comprises at least one monocrystalline seed centrally positioned on an interior bottom surface of the crucible.

13. The crystal growth apparatus of claim 1, wherein the heat exchanger is in thermal contact with the exterior bottom surface of the crucible.

14. The crystal growth apparatus of claim 1, Wherein the feedstock comprises alumna.

15. The crystal gowth apparatus of claim 1, wherein crystal growth apparatus is a sapphire crystal growth apparatus.

* * * * *